(12) United States Patent
Kino

(10) Patent No.: US 8,737,644 B2
(45) Date of Patent: May 27, 2014

(54) REPRODUCING APPARATUS AND REPRODUCING METHOD

(75) Inventor: Yasuyuki Kino, Tokyo (JP)

(73) Assignee: Sony Corporation, Tokyo (JP)

( * ) Notice: Subject to any disclaimer, the term of this patent is extended or adjusted under 35 U.S.C. 154(b) by 540 days.

(21) Appl. No.: 12/465,255

(22) Filed: May 13, 2009

(65) Prior Publication Data

US 2009/0296960 A1    Dec. 3, 2009

(30) Foreign Application Priority Data

May 30, 2008   (JP) ................................. 2008-143125

(51) Int. Cl.
*H03G 3/00*   (2006.01)

(52) U.S. Cl.
USPC ............... 381/104; 381/98; 381/99; 381/101; 381/106; 381/302

(58) Field of Classification Search
USPC ......................................... 381/103, 104, 107
See application file for complete search history.

(56) References Cited

U.S. PATENT DOCUMENTS

| | | | |
|---|---|---|---|
| 2007/0098188 A1* | 5/2007 | Felder | 381/107 |
| 2009/0290727 A1* | 11/2009 | Seefeldt | 381/107 |

FOREIGN PATENT DOCUMENTS

| | | |
|---|---|---|
| EP | 0 377 165 A2 | 7/1990 |
| EP | 0 377 165 A3 | 7/1990 |
| JP | 6-310963 | 11/1994 |
| JP | 9-182197 | 7/1997 |
| JP | 2000-174574 | 6/2000 |
| JP | 2006339864 | * 12/2006 |

OTHER PUBLICATIONS

Office Action issued Oct. 4, 2012 in European Patent Application No. 09 161 543.5.

* cited by examiner

*Primary Examiner* — Minh-Loan T Tran
*Assistant Examiner* — Fazli Erdem
(74) *Attorney, Agent, or Firm* — Oblon, Spivak, McClelland, Maier & Neustadt, L.L.P.

(57) ABSTRACT

A reproducing apparatus includes: a digital signal processing block configured to execute first boost processing for setting a volume level for an entered digital audio signal and boosting an amplitude level of the signal; a digital-to-analog conversion block configured to convert the digital audio signal into an analog one; an analog signal processing block configured to execute second boost processing for boosting an amplitude level of the analog audio signal; an analog volume adjusting block configured to set a volume level for the analog audio signal from the analog signal processing block; a loudspeaker configured to output the analog audio signal from the analog volume adjusting block; an operating block configured to indicate a volume level of an audio signal from the loudspeaker and turn on/off the boost processing for the audio signals; and a control block configured to control components in accordance with an operation by the operating block.

5 Claims, 18 Drawing Sheets

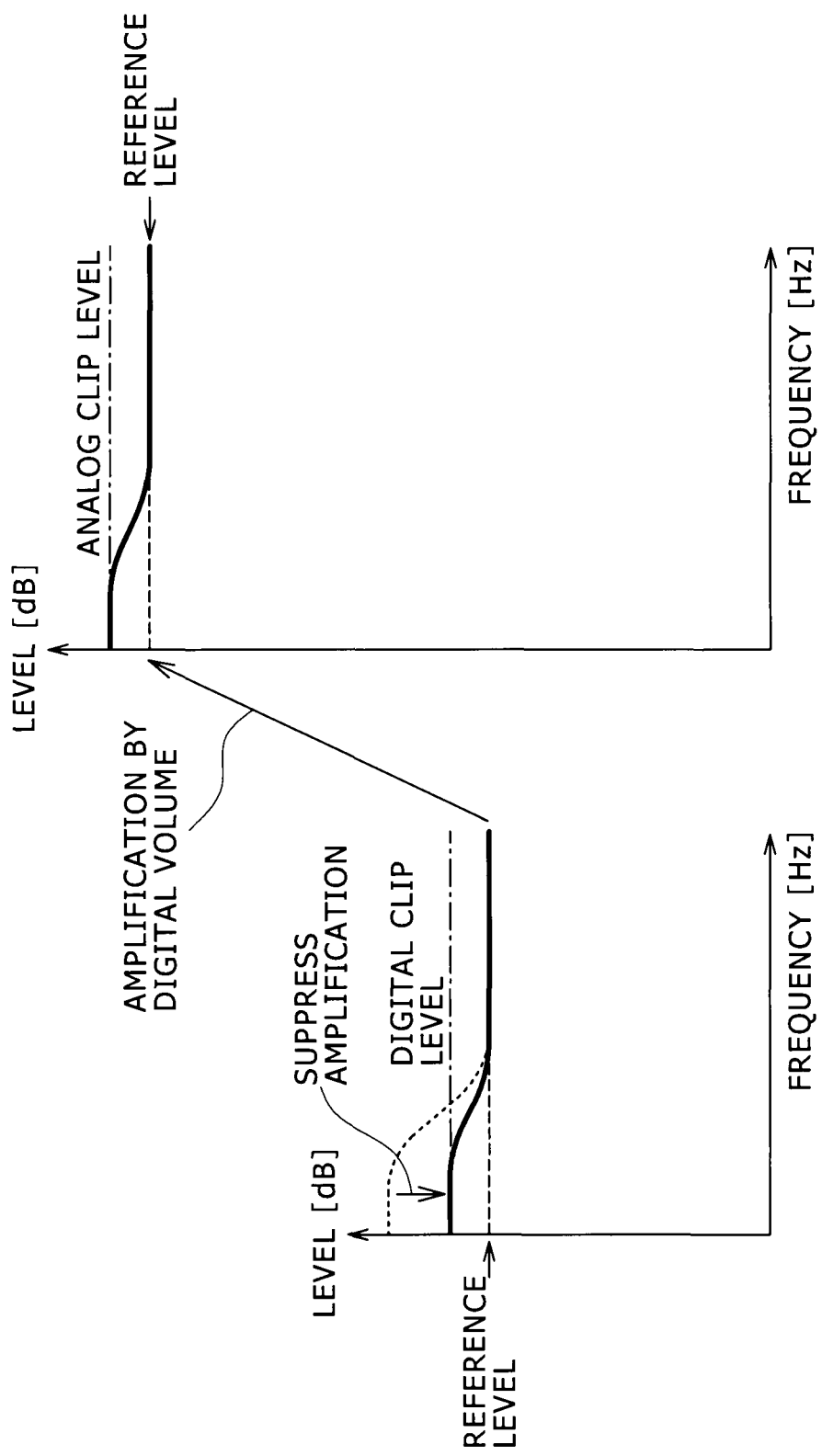
F I G . 4

REPRODUCING APPARATUS AND REPRODUCING METHOD

BACKGROUND OF THE INVENTION

1. Field of the Invention

The present invention relates to a reproducing apparatus and a reproducing method that are configured to prevent audio signal clipping.

2. Description of the Related Art

As shown in FIG. 10, an existing reproducing apparatus 100 is mainly composed of a digital signal processing block 111, an analog signal processing block 112, a D/A (Digital/Analog) conversion block 122, and a loudspeaker 134. The existing reproducing apparatus 100 is configured to reproduce digital audio signals received from a storage device 131 such as HDD (Hard Disc Drive), a disc recording media 132 such as CD (Compact Disc) or DVD (Digital Versatile Disc), and an audio signal source such as a tuner 133 that receives television broadcast or radio broadcast.

A digital audio signal outputted from various audio signal sources such as the storage device 131, the disc recording media 132, or the tuner 133 is supplied to the digital signal processing block 111. The digital signal processing block 111, made up of a DSP (Digital Signal Processor) 121, executes various kinds of signal processing on digital audio signals supplied from various audio signal sources, supplying the processed signals to the D/A conversion block 122. The D/A conversion block 122 converts the received digital audio signals into analog audio signals and supplies the analog audio signals to the analog signal processing block 112.

The analog signal processing block 112 is made up of an analog circuit 123, analog volume 124, and an amplifier 125, for example. The analog circuit 123 receives an analog audio signal from the D/A conversion block 122 and executes various kinds of signal processing such as amplification on the received analog audio signal, supplying the processed signal to the analog volume 124. The analog volume 124 amplifies the received analog audio signal on the basis of an operation done by a user through an operating block not shown and supplies the amplified signal to the loudspeaker 134. The loudspeaker 134 outputs the received analog audio signal.

With respect to the above-mentioned reproducing apparatus, Japanese Patent Laid-open No. 2000-174574 discloses a volume cutback apparatus configured to arrange a digital volume and an analog volume, in which the digital volume is adjusted if a volume setting is in excess of a preset threshold and the analog volume is adjusted if a volume setting is below a preset threshold.

Some of the reproducing apparatuses 100 have an effect capabilities for highlighting a particular band among audio signal frequency bands. For these effect capabilities, boost processing is known in which the low frequency side of the frequency band of audio signal is amplified to obtain an effect of highlighting the low frequency side, for example.

Normally, the boost processing for amplifying a signal component of a particular frequency band, such as the low frequency side, may be executed in a method in which a particular frequency band of audio signal is amplified in the analog domain or a method in which a particular frequency band of audio signals amplified in the digital domain.

First, a method of executing boost processing on an audio signal in the analog domain will be described. FIG. 11 shows an exemplary configuration of a reproducing apparatus 100', in which boost processing is executed in the analog domain. With reference to FIG. 11, components similar to those previously described with reference to the reproducing apparatus 100 shown in FIG. 10 are denoted by the same reference numerals and the description thereof will be skipped.

In this example, an analog circuit 123 arranged in an analog signal processing block 112 is configured to execute boost processing in which the low frequency component of each analog audio signal is amplified. The analog circuit 123 amplifies the low frequency component of an analog audio signal to a predetermined level on the basis of a boost signal supplied from a control block 113 to be described later. An analog volume 124 amplifies the analog audio signal to a predetermined level on the basis of a volume signal supplied from the control block 113.

When a user operates an operating block 114 to turn on boost processing, the control block 113 generates a boost signal for amplifying the low frequency component of an analog audio signal and supplies the generated boost signal to the analog circuit 123. Also, if the user operates the operating block 114 to set the volume to a predetermined level, the control block 113 generates a volume signal for amplifying an analog audio signal in accordance with the set volume and supplies the generated volume signal to the analog volume 124.

FIG. 12 shows the frequency characteristics of audio signals outputted from the DSP 121 that is the digital domain and the analog volume 124 that is the analog domain when boost processing is executed in the analog domain. The graph on the left shows the frequency characteristic of a digital audio signal outputted from the DSP 121. The graph on the right shows the frequency characteristic of an analog audio signal outputted from the analog volume 124.

A digital clip level and an analog clip level over which clipping will occur are preset for each of the audio signals to be entered in the DSP 121 and the analog volume 124.

When the user operates the operating block 114 to raise volume, the analog audio signal is amplified to a predetermined level in the analog volume 124 as shown in FIG. 12, thereby raising the reference level of the analog audio signal relative to the reference level of the digital audio signal. Also, the low frequency component of the analog signal is further amplified to a predetermined level by the boost processing in the analog circuit 123.

The following describes a method of executing boost processing on an audio signal in the digital domain. FIG. 13 shows an exemplary configuration of a reproducing apparatus 100" for executing boost processing in the analog domain. With reference to FIG. 13, components similar to those previously described with reference to the reproducing apparatus 100 and the reproducing apparatus 100' shown in FIG. 10 and FIG. 11 are denoted by the same reference numerals and the description thereof will be skipped.

In this example, boost processing for amplifying the low frequency component of each digital audio signal is executed in a DSP 121 arranged in a digital signal processing block 111. The DSP 121 amplifies the low frequency component of a digital audio signal to a predetermined level on the basis of a boost signal supplied from a control block 113.

FIG. 14 shows the frequency characteristics of the audio signals that are outputted from the DSP 121 and an analog volume 124 when boost processing is executed in the digital domain. When the user operates an operating block 114 to turn on boost processing, boost processing is executed on a digital audio signal in the DSP 121 to amplify the low frequency component of the digital audio signal.

At this moment, if the amplitude level of the digital audio signal outputted from the DSP 121 is relatively high and therefore there is little margin up to a digital clip level, the low frequency component amplified by the boost processing may possibly exceed the digital clip level. Therefore, in such a situation, attenuation processing is executed in order to lower the reference level of the digital audio signal once, thereby preventing the low frequency component of the digital audio signal from exceeding the digital clip level, as shown in FIG. 14.

As described above, the low frequency component can be prevented from exceeding the digital clip level in the digital domain by executing boost processing with the reference level of a digital audio signal lowered to amplify the low frequency component of the digital audio signal to a predetermined level.

It should be noted that, in executing boost processing in the digital domain, the reference level of a digital audio signal is lowered by executing attenuation processing and the reference level of an analog audio signal is raised in the analog domain by the amount lowered by the attenuation processing. Hence, there is no variation in the total reference level of the digital domain and the analog domain.

Next, when the user raises volume through the operating block 114, the analog audio signal is amplified to a predetermined level in the analog volume 124, thereby raising the reference level of the analog audio signal relative to the reference level of the digital audio signal.

Thus, in the existing reproducing apparatuses, boost processing is executed on audio signals in the analog domain or the digital domain.

SUMMARY OF THE INVENTION

However, executing boost processing in the analog domain or the digital domain involves problems such as described below.

If, in executing boost processing in the analog domain, the volume is further raised by the user through the operating block 114, the amplification amount in the analog volume 124 is further increased as shown in FIG. 15. So, the low frequency component of the analog audio signal amplified by the boost processing may exceed the analog clip level. If this happens, the low frequency component of the analog audio signal clips, thereby presenting a problem of the distorted sound outputted from the loudspeaker 134.

Also, if, in executing boost processing in the digital domain, the user further raises the volume through the operating block 114, the amplification amount in the analog volume 124 is further increased as with the above-mentioned boost processing in the analog domain. So, as shown in FIG. 16, the low frequency component of the analog audio signal amplified by the boost processing exceeds the analog clip level, thereby presenting problem of the distorted sound outputted from the loudspeaker 134.

As described above, for a method of preventing the clipping of audio signals, a compressor method is known in which the amplification amount of the audio signal to be amplified by boost processing is limited in the digital domain.

For example, as shown in FIG. 17, if the amplitude level of a digital audio signal to be entered in the DSP 121 is low, so that, if the low frequency component is amplified by the boost processing, the digital clip level will not be exceeded, the low frequency component of the digital audio signal is amplified to a maximum level.

On the other hand, if the amplitude level of a digital audio signal to be entered in the DSP 121 is relatively high and therefore the low frequency component amplified by the boost processing exceeds the digital clip level as shown in FIG. 18, the amplitude level of the audio signal is limited by the compressor processing to prevent the digital clip level from being exceeded. This configuration can prevent the analog clip level from being exceeded even if the analog audio signal is significantly amplified by the analog volume 124.

However, in the above-mentioned configuration, a decision whether or not the amplification amount of a particular frequency band by boost processing is to be limited depends only on the digital audio signal that is entered in the DSP 121. So, if the amplification amount by the analog volume 124 is not relatively large and the amplitude level of a particular frequency band does not exceed the analog clip level in the analog domain, the amplification amount of the particular frequency band will be limited. Therefore, if there is a margin up to the analog clip level in the analog domain, there occurs a problem of the lowered effect of boost processing.

Therefore, the present invention addresses the above-identified and other problems associated with existing methods and apparatuses and solves the addressed problems by providing a reproducing apparatus and a reproducing method that are configured to properly reproduce audio signals without involving clipping.

In carrying out the invention and according to a first form thereof, there is provided a reproducing apparatus. This reproducing apparatus has a digital signal processing block configured to execute first boost processing for setting a volume level for an entered digital audio signal and boosting an amplitude level of a predetermined frequency band of the digital audio signal; a digital-to-analog conversion block configured to convert the digital audio signal into an analog audio signal; and an analog signal processing block configured to execute second boost processing for boosting an amplitude level of the predetermined frequency band of the analog audio signal. The apparatus further has an analog volume adjusting block configured to set a volume level for the analog audio signal outputted from the analog signal processing block; a loudspeaker configured to output the analog audio signal outputted from the analog volume adjusting block; an operating block configured to indicate a volume level of an audio signal outputted from the loudspeaker and turn on/off the boost processing for the audio signals; and a control block configured to control components of the reproducing apparatus in accordance with an operation done through the operating block. The control block executes, on the basis of an operation done through the operating block, one of the first boost processing and the second boost processing when the boost processing is turned on and, if a volume level at which an analog audio signal clips is set, suppresses an amount of boost by one of the first boost processing and the second boost processing so as to prevent the analog audio signal from clipping.

In carrying out the invention and according to a second form thereof, there is provided a reproducing method. This reproducing method has the steps of executing first boost processing for setting a volume level for an entered digital audio signal and boosting an amplitude level of a predetermined frequency band of the digital audio signal; converting the digital audio signal into an analog audio signal; and executing second boost processing for boosting an amplitude level of the predetermined frequency band of the analog audio signal. The method further has the steps of setting a volume level for the analog audio signal outputted from the analog signal processing step; outputting the analog audio signal outputted from the analog volume adjusting step; indicating a volume level of an audio signal outputted from the loudspeaker and turning on/off the boost processing for the audio signals; and controlling components of a reproducing apparatus in accordance with an operation done through the operating block. The control step executes, on the basis of an operation done through the operating block, one of the first boost processing and the second boost processing when the boost processing is turned on and, if a volume level at which an analog audio signal clips is set, suppresses an amount of boost by one of the first boost processing and the second boost processing so as to prevent the analog audio signal from clipping.

As described above and according to the invention, in the first and second forms thereof, the first boost processing for setting a volume level for an entered digital audio signal and boosting an amplitude level of a predetermined frequency band of the digital audio signal is executed; the digital audio signal is converted into an analog audio signal; second boost processing for boosting an amplitude level of the predetermined frequency band of the analog audio signal is executed; a volume level for the analog audio signal outputted from the analog signal processing step is set; the analog audio signal outputted from the analog volume adjusting step is outputted; a volume level of an audio signal outputted from the loudspeaker and turning on/off the boost processing for the audio signals are indicated; and components of a reproducing apparatus are controlled in accordance with an operation done through the operating block; wherein, on the basis of an operation done through the operating block, the control step executes one of the first boost processing and the second boost processing when the boost processing is turned on and, if a volume level at which an analog audio signal clips is set, suppresses an amount of boost by one of the first boost processing and the second boost processing so as to prevent the analog audio signal from clipping.

In the present invention, the amplification amount of boost by boost processing for any one of a digital audio signal and an analog audio signal is suppressed so as to prevent the analog audio signal from clipping if the analog audio signal is set to a volume level at which the analog audio signal clips. Consequently, the present invention provides effects that, if an audio signal is set to any volume level, the audio signal can be reproduced without distortion.

BRIEF DESCRIPTION OF THE DRAWINGS

FIG. 4 shows graphs indicative of processing for audio signals with volume levels set higher;

DETAILED DESCRIPTION OF THE PREFERRED EMBODIMENTS

Figure 1:
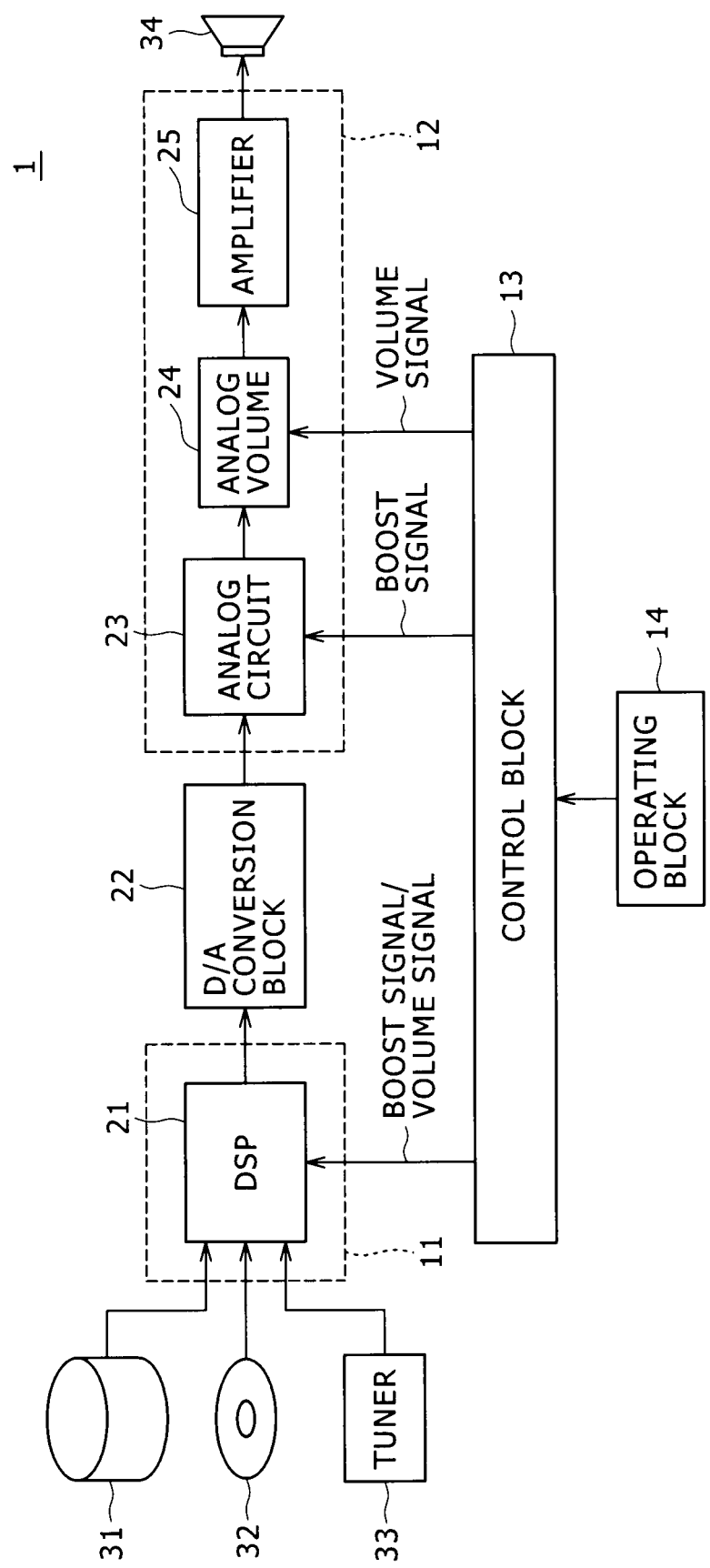
FIG. 1 is a block diagram illustrating an exemplary configuration of a reproducing apparatus practiced as a first embodiment of the invention.

This invention will be described in further detail by way of embodiments thereof with reference to the accompanying drawings. Now, referring to FIG. 1, there is shown an exemplary configuration of a reproducing apparatus 1 practiced as a first embodiment of the invention. The reproducing apparatus 1 has a digital signal processing block 11, an analog signal processing block 12, a control block 13, an operating block 14, a D/A (Digital/Analog) conversion block 22, and a loudspeaker 34. The reproducing apparatus 1 receives digital audio signals from audio signal sources including a storage device 31 such as HDD (Hard Disc Drive), a disc recording media 32 such as CD (Compact Disc) or DVD (Digital Versatile Disc), and a tuner 33 that receives television broadcast and radio broadcast and supplies the received digital audio signals to the digital signal processing block 11.

The digital signal processing block 11 is made up of a DSP (Digital Signal Processor) 21, for example. Under the control of a control block 13 to be described later, the DSP 21 executes predetermined signal processing on each digital audio signal. For example, as the signal processing, the DSP 21 executes boost processing for amplifying the signal component of a particular frequency band of a digital audio signal by a preset amount and processing for suppressing the amplification amount in the boost processing. The D/A conversion block 22 converts a digital audio signal received from the DSP 21 into an analog audio signal.

The analog signal processing block 12 is made up of an analog circuit 23, an analog volume 24, and an amplifier 25, for example. Under the control of the control block 13, the analog circuit 23 executes various kinds of signal processing such as boosting on the analog audio signal received from the D/A conversion block 22. Under the control of the control block 13, the analog volume 24 amplifies the analog audio signal to a predetermined level and supplies the amplified analog audio signal to the loudspeaker 34. The loudspeaker 34 outputs the received analog audio signal.

The operating block 14 is an operating block arranged on a panel or the like of the reproducing apparatus 1 or a remote control commander, for example, and is operated to use various kinds of effect capabilities, such as the volume level adjustment and boost processing of audio signals. Operated by the user, the operating block 14 generates control signals according to operations and supply the generated control signals to the control block 13.

In accordance with the control signals supplied from the operating block 14, the control block 13 controls each components of the reproducing apparatus 1. On the basis of the control signals supplied from the operating block 14, the control block 13 generates a boost signal for executing boost processing for amplifying the component of a particular frequency band of the audio signal and supplies the generated boost signal to the analog circuit 23. In addition, on the basis of the control signals supplied from the operating block 14, the control block 13 generates a volume signal for setting an amplification amount of the audio signal and supplies the generated volume signal to the DSP 21 and the analog volume 24.

Figure 2:
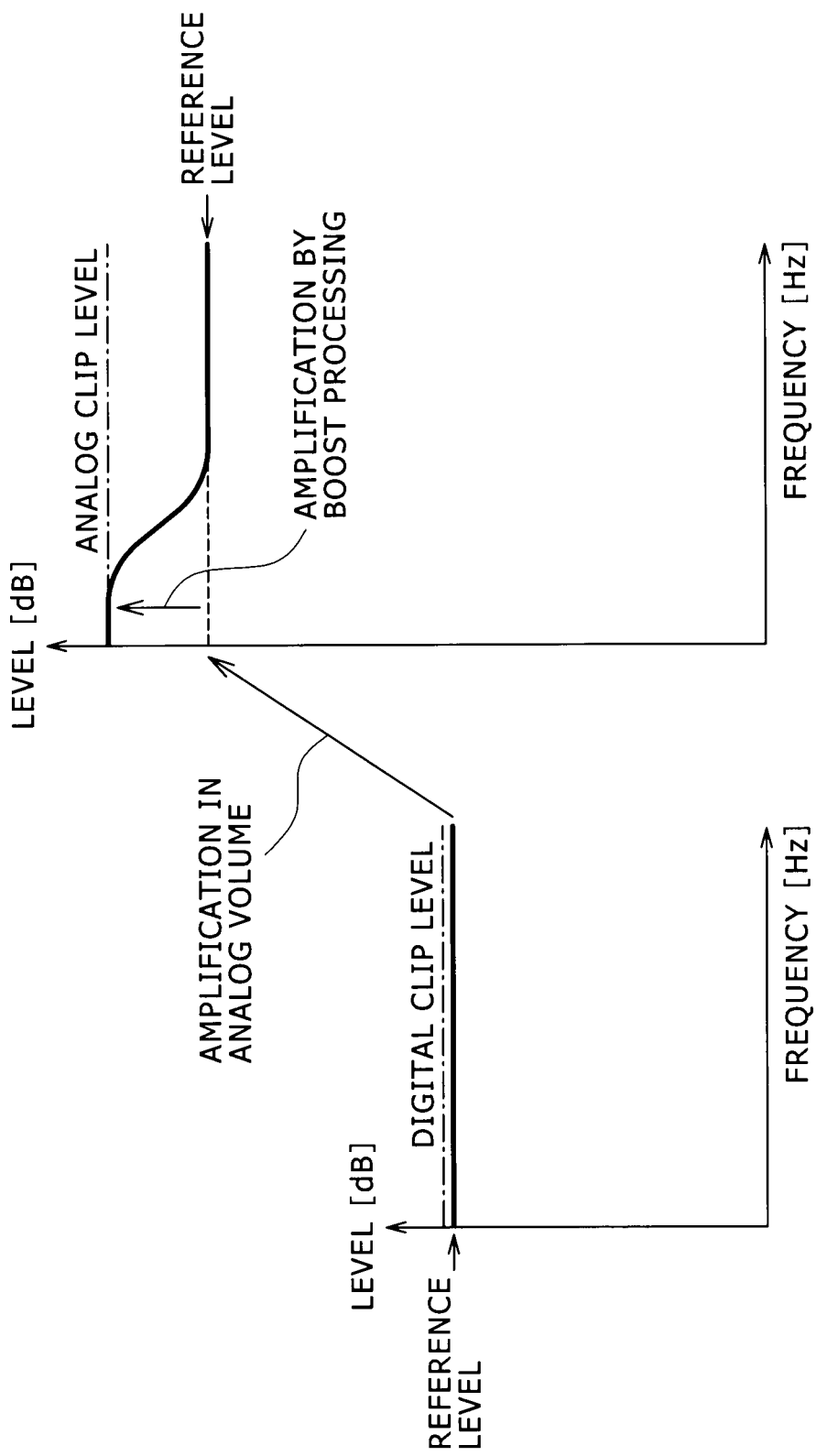
FIG. 2 shows graphs indicative of processing for audio signals with volume levels set relatively low.

In the reproducing apparatus 1 configured as described above, assume that boost processing for amplifying the low frequency component of an audio signal be executed, for example. FIG. 2 shows the frequency characteristics of audio signals when boost processing for the low frequency component of the audio signals is executed in the analog domain. The graph on the left side shows the frequency characteristic of a digital audio signal outputted from the DSP 21. The graph on the right side shows the frequency characteristic of an analog audio signal outputted from the analog volume 24. The horizontal axis shows the frequency of each audio signal and the vertical axis shows the amplitude level according to the frequency.

A digital clip level indicative of a level at which a signal clips is set beforehand for the amplitude level of each digital audio signal to be entered in the DSP 21. Likewise, an analog clip level indicative of a level at which signal clips is set beforehand for the amplitude level of an analog audio signal to be entered in the analog volume 24. These clip levels are determined by the performance of the DSP 21 and the analog volume 24.

The analog audio signal to be entered in the analog volume 24 can be further amplified by the analog volume 24 relative to the digital audio signal outputted from the DSP 21. So, normally, the analog clip level is higher than the digital clip level.

If boost processing is turned on by an operation of the user through the operating block 14 to set the volume level relatively low, executing the boost processing will not make the low frequency component of the audio signal exceed the analog clip level in the analog domain, so that no clip occurs. Therefore, as shown in FIG. 2, the boost processing in the digital domain is not executed, but the boost processing is executed in the analog domain.

Figure 15:
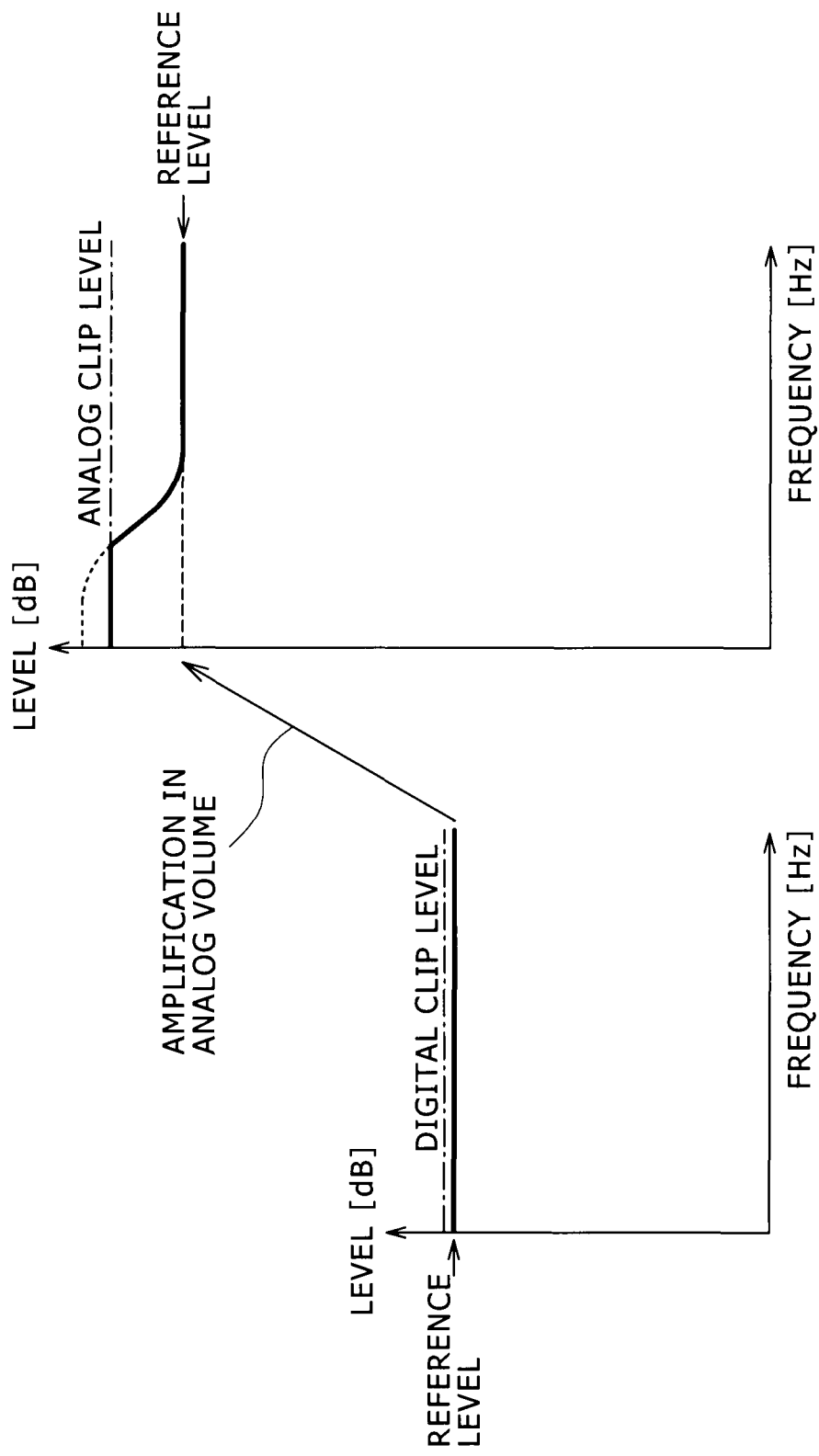
FIG. 15 shows graphs indicative of audio signals with boost processing executed in the analog domain.
Figure 16:
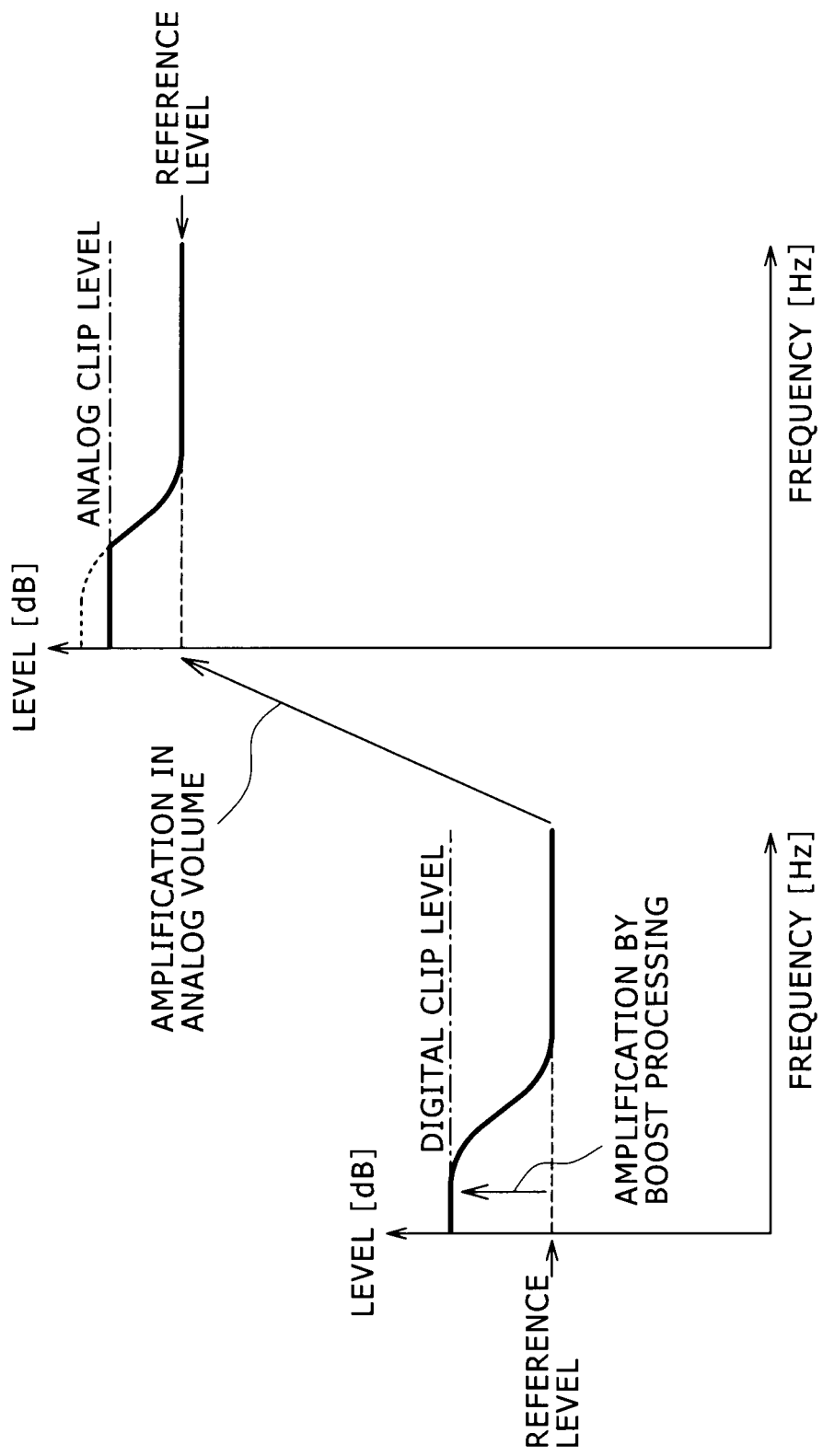
FIG. 16 shows graphs indicative of audio signals with boost processing executed in the digital domain.
Figure 17:
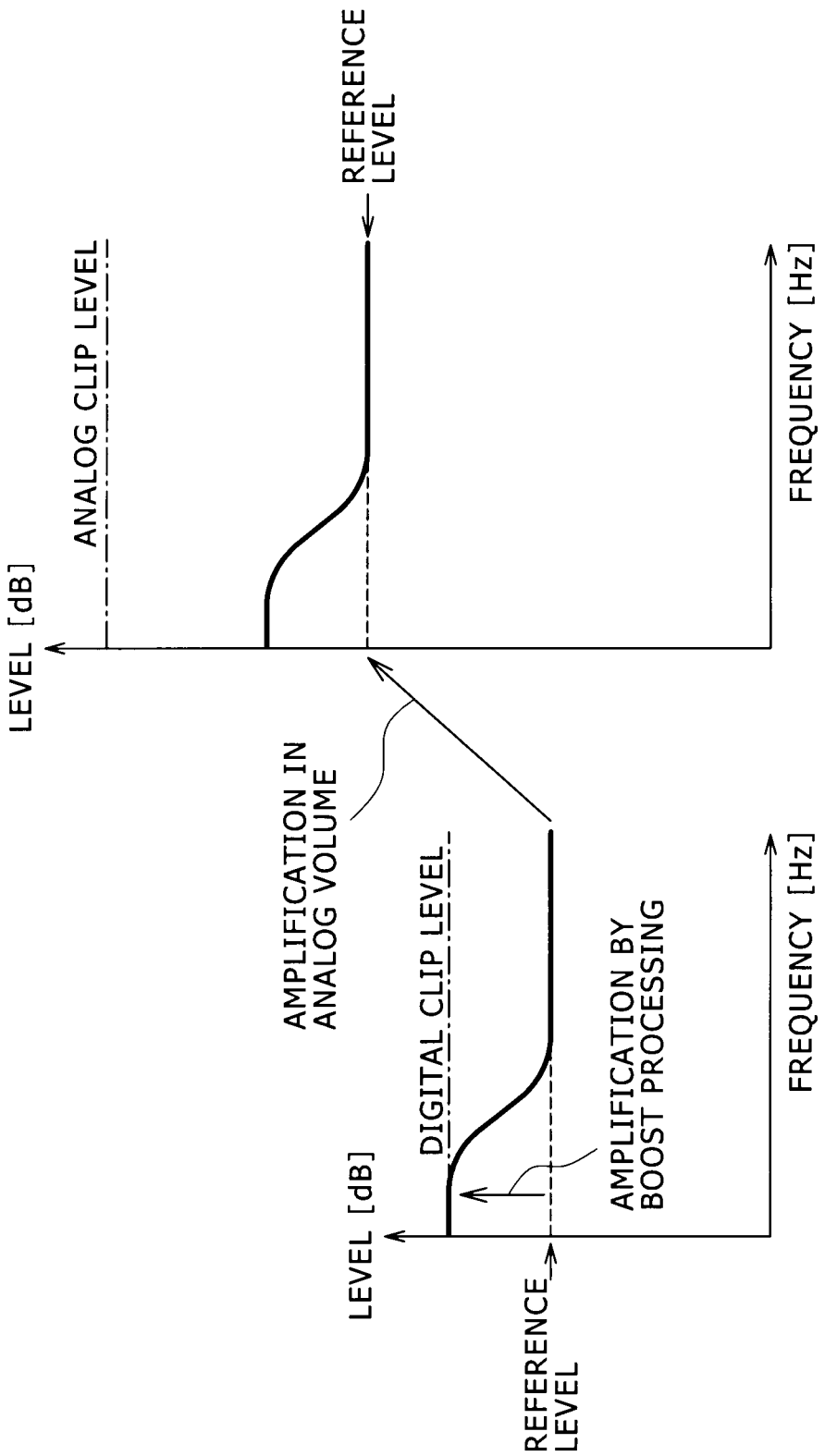
FIG. 17 shows graphs indicative of audio signals with amplification amount limited by boost processing.
Figure 18:
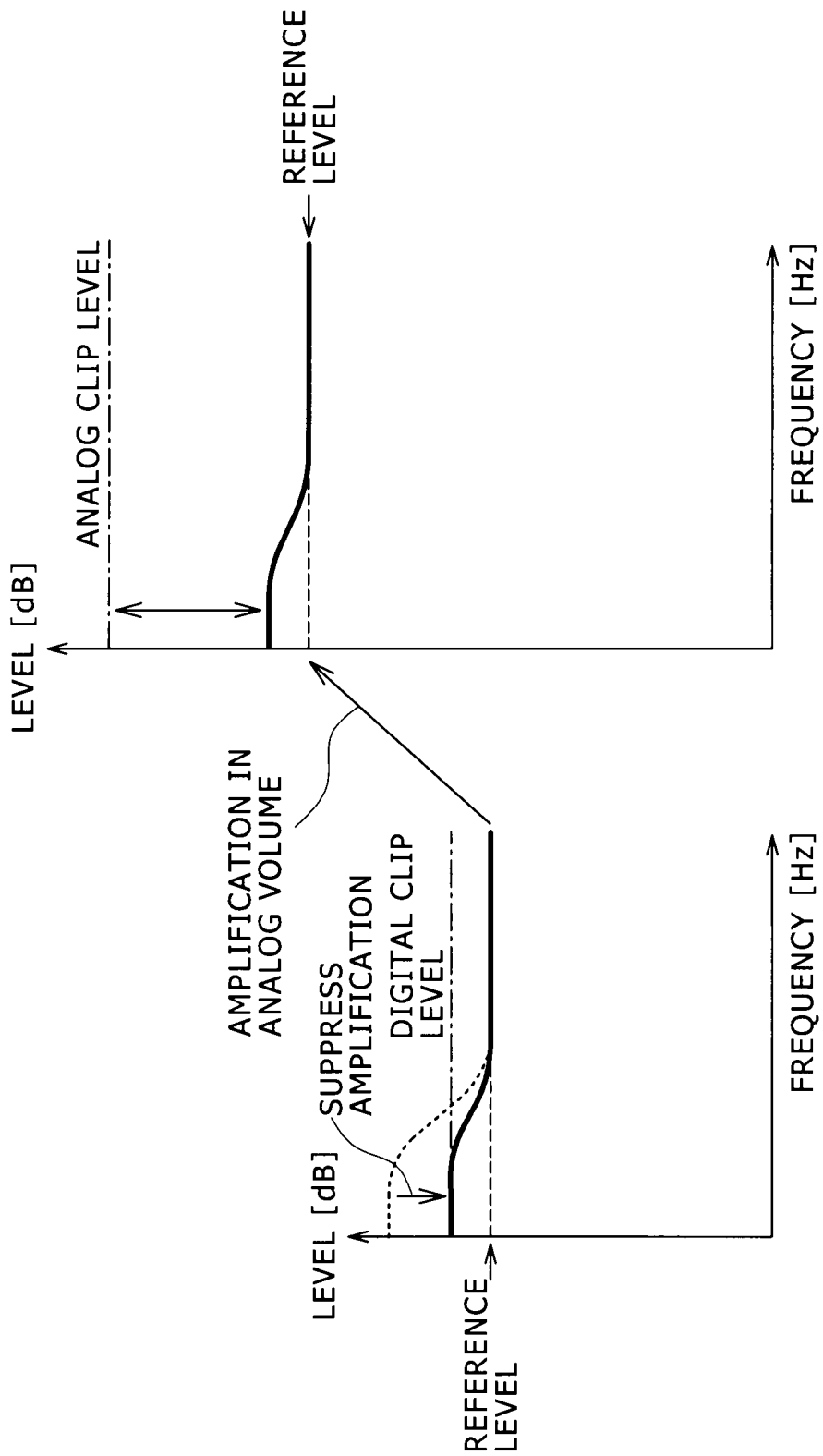
FIG. 18 shows graphs indicative of audio signals with amplification amount limited by boost processing.

If the operating block 14 is further operated by the user from the above-mentioned state to set the volume level higher, the low frequency component of the audio signal amplified by the boost processing exceeds the analog clip level as shown in FIG. 15 as described in the background of the invention hereof. Therefore, the low frequency component of the audio signal clips, thereby distorting the outputted sound.

So, if the setting is made at the volume level where the low frequency component of an audio signal clips, the boost processing in the analog domain is switched to the boost processing in the digital domain.

If, at this moment, the amplitude level of the digital audio signal entered in the DSP 21 is relatively high and therefore there is little margin up to the digital clip level, for example, the low frequency component amplified by the boost processing may possibly exceed the digital clip level. So, attenuation processing is executed so as to lower the reference level of the digital audio signal once, thereby preventing the low frequency component of the digital audio signal from exceeding the digital clip level.

It should be noted that, if the boost processing is executed in the digital domain, the reference level of a digital audio signal is lowered by attenuation processing, but the reference level of an analog audio signal is raised in the analog domain by the amount lowered. Hence, there is no variation in the total reference level in the digital domain and the analog domain.

If the volume level is set higher, the amplification by the analog volume 24 in the analog domain is switched to the digital volume for raising the reference level of the digital audio signal entered in the DSP 21 in the digital domain. It should be noted that the digital volume is executed by the DSP 21, adjusting the reference level of the digital audio signal on the basis of a volume signal supplied from the control block 13.

If a digital audio signal with a relatively high amplitude level is entered in the DSP 21 with an amplification amount of the low frequency component by the boost processing in the digital domain maintained, the low frequency component of the audio signal clips in the digital domain. Therefore, in such a case, the amplification amount by the boost processing is suppressed to prevent the low frequency component from exceeding the digital clip level as shown in FIG. 4.

Namely, if the amplitude level of the digital audio signal to be entered in the DSP 21 is relatively high, the amplification amount of the low frequency component by the boost processing is suppressed. If the amplitude level of the digital audio signal is relatively low, the original amplification amount by the boost processing is maintained.

Figure 5:
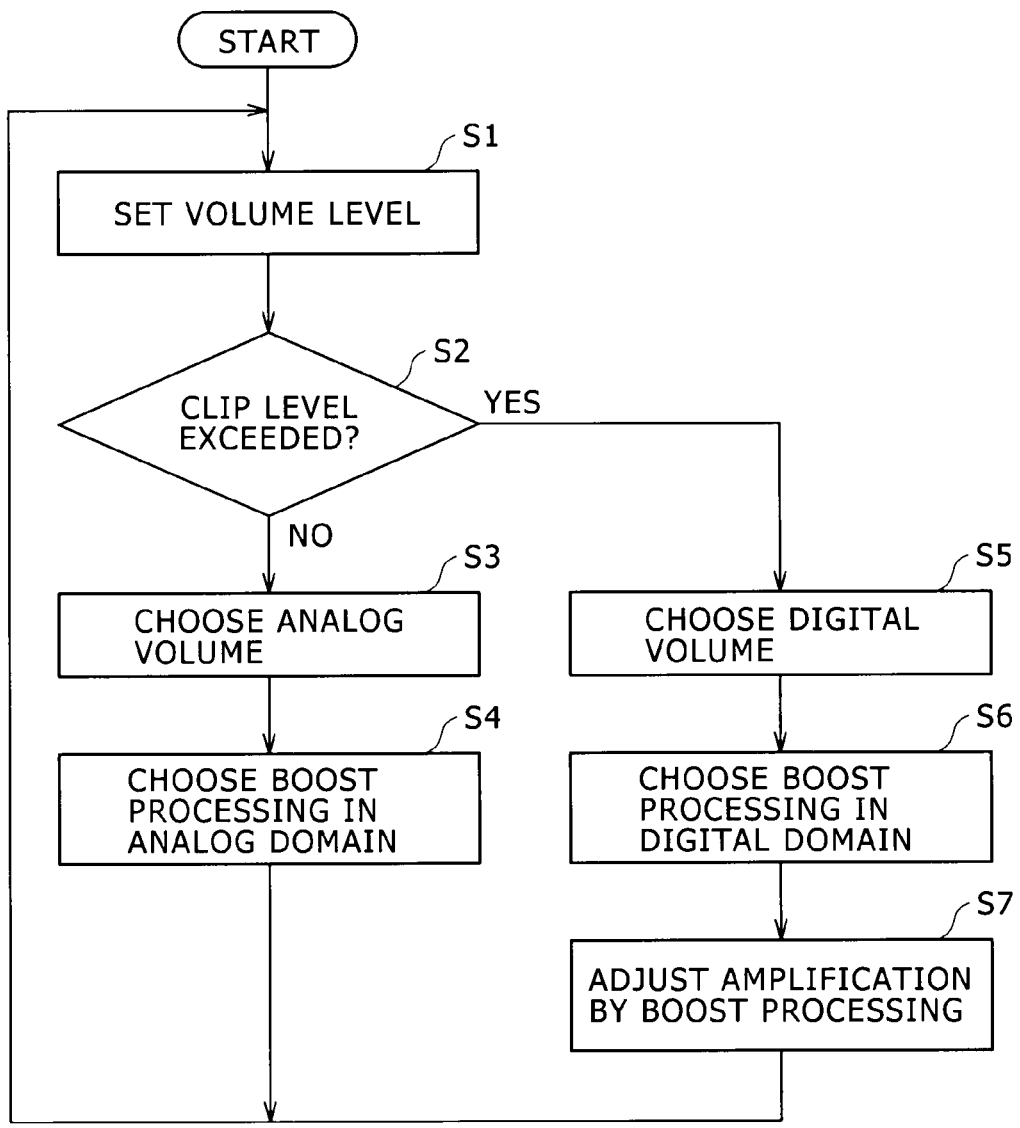
FIG. 5 is a flowchart indicative of reproduction processing of an audio signal according to the first embodiment of the invention.

The following describes a flow of the reproduction processing of audio signals according to the first embodiment of the invention with reference to FIG. 5. It should be noted that, unless otherwise specified, the processing described below is executed under the control of the control block 13. It should also be noted that, as an initial state, the setting of the volume level of an audio signal is executed by the analog volume 24 and the boost processing on an audio signal is executed in the analog domain.

In step S1, when a volume level is set by the user through the operating block 14, an analog audio signal is amplified by the analog volume 24 in accordance with the set volume level.

In step S2, the control block 13 determines whether or not the analog audio signal is in excess of the analog clip level. If the analog audio signal is found not in excess of the analog clip level, the procedure goes to step S3, in which the analog volume 24 is chosen as the volume for use in setting a volume level. It should be noted that, in the initial state, the setting of volume level is executed by the analog volume 24, so that the analog volume 24 is chosen as it is. Also, if the setting of volume level was executed by the digital volume in the DSP 21 in a previous stage, the analog volume 24 is chosen.

In step S4, the boost processing in the analog domain is chosen. It should be noted that, in the initial state, the boost processing is executed in the analog domain, so that the boost processing in the analog domain is continued as it is. If the boost processing was executed in the digital domain in a previous stage, the boost processing in the digital domain is switched to the boost processing in the analog domain. Then, the procedure returns to step S1.

On the other hand, if the analog audio signal is found in excess of the analog clip level in step S2, then the procedure goes to step S5, in which the digital volume is chosen as a volume for use in the setting of volume level. If the setting of volume level was executed by the analog volume 24 in a previous stage, the digital volume is chosen. Also, if the setting of volume level was executed by the digital volume in a previous stage, the digital volume is chosen as it is.

In step S6, the boost processing in the digital domain is chosen. If the boost processing was executed in the analog domain in a previous stage, the boost processing in the analog domain is switched to the boost processing in the digital domain. If the boost processing was executed in the digital domain in a previous stage, the boost processing is continued as it is.

In step S7, an amplification amount is adjusted by the boost processing so as to prevent the low frequency component of the digital audio signal amplified by the boost processing from exceeding the digital clip level.

Then, when the processing of step S5 or step S7 has been completed, the procedure returns to step S1, in which, when the setting of volume level is executed again, the above-mentioned sequence of processing is repeated.

Thus, in the first embodiment of the invention, the domain in which control of volume level is executed is switched from the analog domain to the digital domain in accordance with a volume level to be set or the amplitude level of an audio signal to be entered. Also, the domain in which boost processing is executed is switched from the analog domain to the digital domain. Further, if a higher volume level is set in the execution of boost processing in the digital domain, the amplification amount of the signal component in a particular frequency band is suppressed by boost processing. Consequently, the distortion of audio signals due to clipping can be prevented, thereby properly reproducing audio signals.

The following describes a variation to the first embodiment of the invention. In the above-mentioned first embodiment, if a volume level that may cause analog audio signals to clip is set, the volume for use in volume level setting is switched from the analog volume 24 to the digital volume.

In this case, a digital audio signal is attenuated in the digital domain and an analog audio signal is amplified in the analog domain. However, attenuating a digital audio signal in the digital domain reduces the information amount of an audio signal, thereby deteriorating the S/N (Signal to Noise) ratio of the audio signal that is outputted from the reproducing apparatus 1.

So, in the variation to the first embodiment of the invention, in order to prevent the deterioration of the S/N ratio, the setting of the volume level of an audio signal is always executed by the analog volume 24 without using the digital volume.

Figure 3:
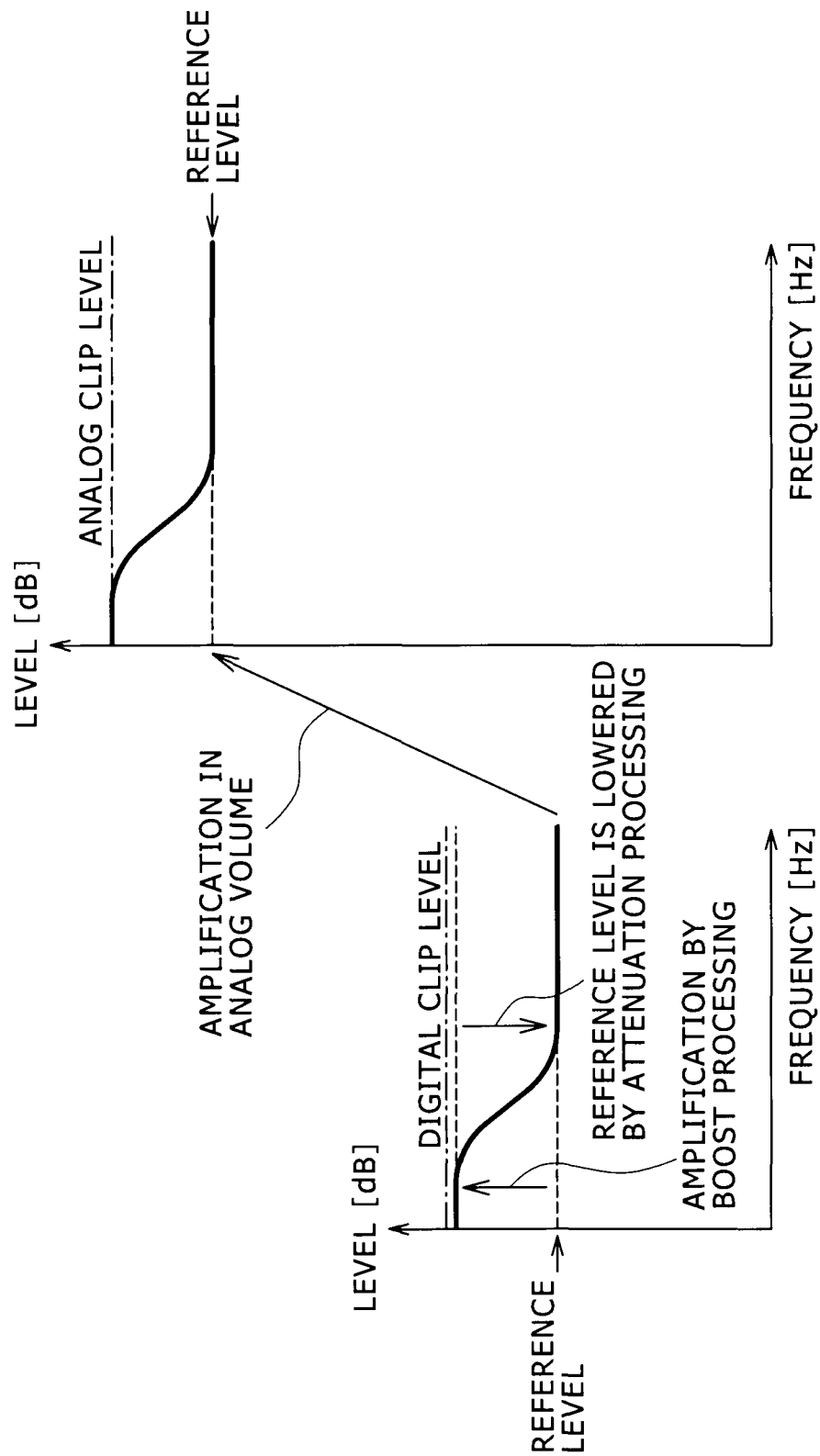
FIG. 3 shows graphs indicative of processing for audio signals with volume levels set relatively high.

For example, as shown in FIG. 3, assume the boost processing on a digital audio signal in the digital domain. If, from this state, an analog audio signal is set to a volume level at which the analog audio signal may possibly clip in the analog domain, by the user through the analog volume 24, the analog volume 24 is continuously used in this variation to the first embodiment.

Figure 6:
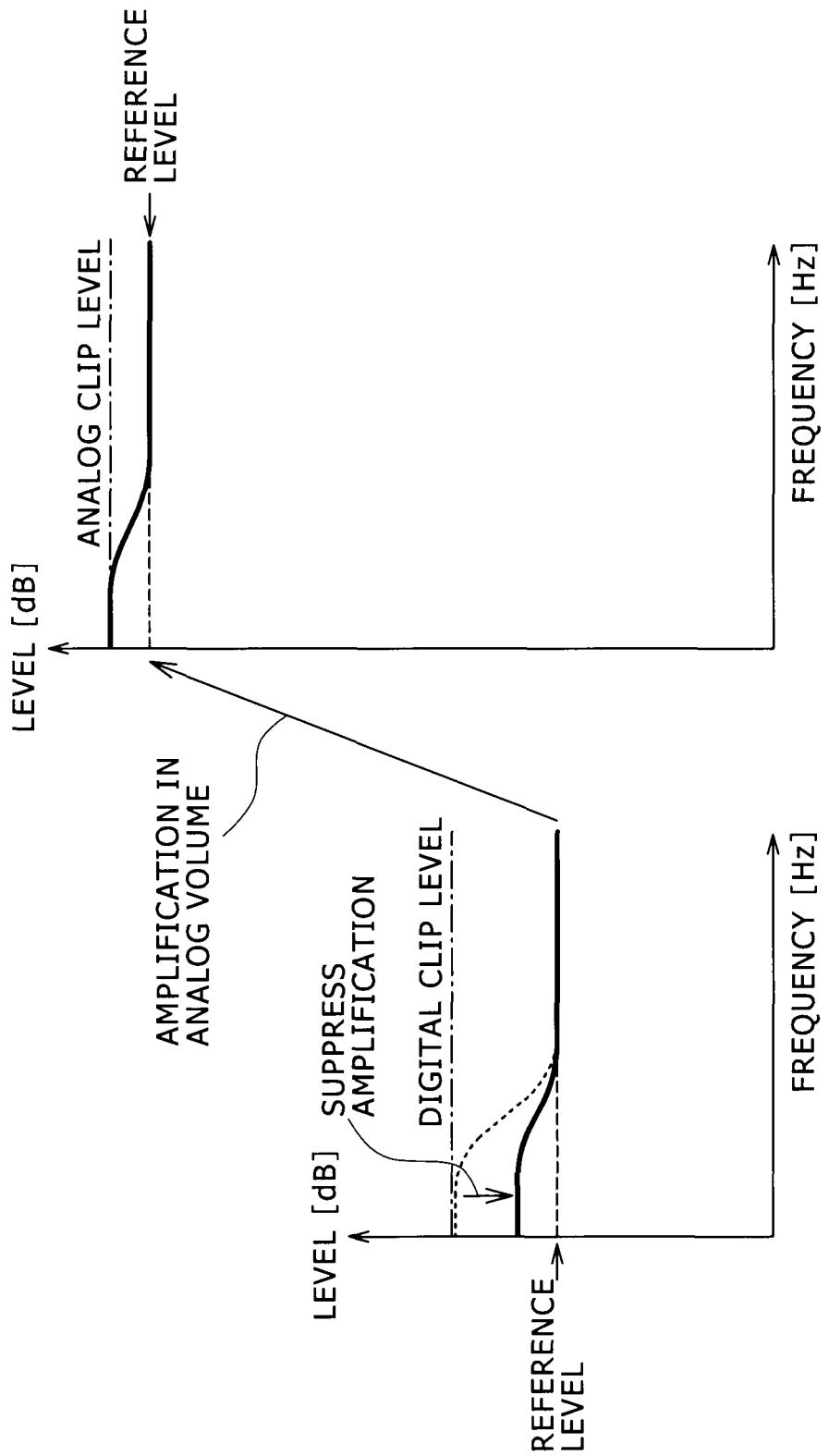
FIG. 6 shows graphs indicative of processing for audio signals with volume levels set higher in one variation to the first embodiment of the invention.

At this moment, amplifying the analog audio signal by the analog volume 24 the low frequency component of the analog audio signal clips. So, as shown in FIG. 6, the amplification amount of the low frequency component by the boost processing in the digital domain is suppressed to prevent the low frequency component of the analog audio signal from exceeding the analog clip level.

As described above, in this variation to the first embodiment, if there is a possibility of clipping in the analog domain, the amplification amount by the boost processing is suppressed if no clipping occurs in the digital domain.

Figure 7:
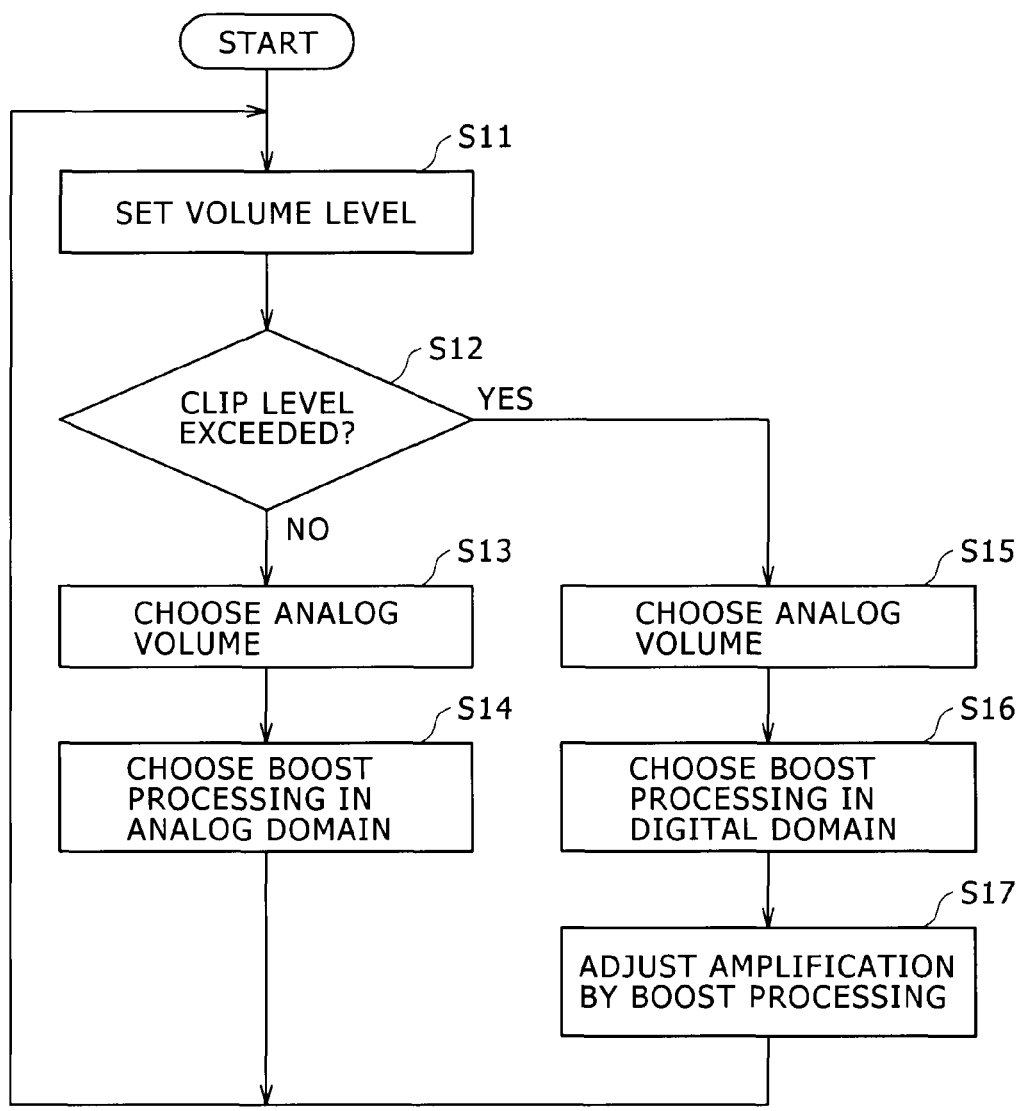
FIG. 7 is a flowchart indicative of reproduction processing of an audio signal according to the variation to the first embodiment of the invention.

The following describes the reproduction processing of an audio signal according to the above-mentioned variation to the first embodiment of the invention with reference to FIG. 7. It should be noted that, unless otherwise specified, the processing shown below is executed under the control of the control block 13. It is also assumed that the boost processing on an audio signal be executed in the analog domain as an initial state.

In step S11, when a volume level in accordance with an operation by the user through the operating block 14 is set, an analog audio signal is amplified by the analog volume 24 in accordance with the set volume level.

In step S12, the control block 13 determines whether or not the analog audio signal is in excess of the analog clip level. If the analog audio signal is found not in excess of the analog clip level, the procedure goes to step S13, in which the analog volume 24 is chosen as it is as the volume for use in setting the volume level.

In step S14, the boost processing in the analog domain is chosen. It should be noted that, in the initial state, the boost processing has been executed in the analog domain, so that the boost processing in the analog domain is continued as it is. If the boost processing was executed in the digital domain in a previous stage, the boost processing in the digital domain is switched to the boost processing in the analog domain. Then, the procedure returns to step S11.

On the other hand, if the analog audio signal is found in excess of the analog clip level in step S12, then the procedure goes to step S15, in which the analog volume 24 is chosen as it is as the volume for use in setting the volume level.

In step S16, the boost processing in the digital domain is chosen. If the boost processing was executed in the analog domain in a previous stage, the boost processing in the analog domain is switched to the boost processing in the digital domain. If the boost processing was executed in the digital domain in a previous stage, the boost processing is continued as it is.

In step S17, the amplification amount by the boost processing is adjusted so as to prevent the low frequency component of the analog audio signal in the analog domain from exceeding the analog clip level.

Then, when the processing of step S15 or step S17 has been completed, the procedure returns to step S11, in which, when the setting of volume level is executed again, the above-mentioned sequence of processing is repeated.

As described above, in this variation to the first embodiment of the invention, the amplification amount of the low frequency component is suppressed by the boost processing in the digital domain. Consequently, if the analog audio signal is amplified by the analog volume 24, the clipping of the analog audio signal can be prevented.

The following describes a second embodiment of the invention. In the second embodiment of the invention, the boost processing for amplifying the signal component of a particular frequency band of an audio signal is always executed in the digital domain.

Figure 8:
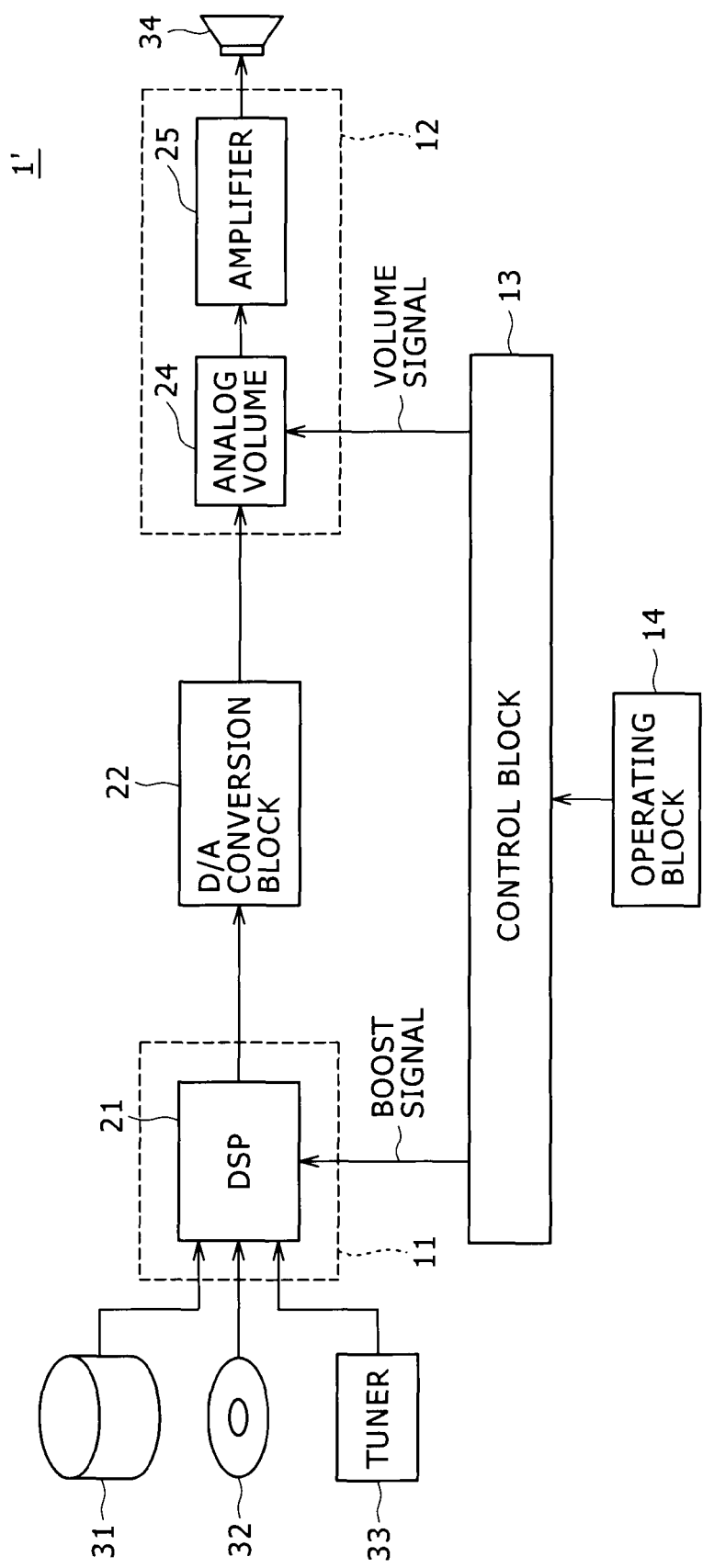
FIG. 8 is a block diagram illustrating an exemplary configuration of a reproducing apparatus practiced as a second embodiment of the invention.

FIG. 8 shows an exemplary configuration of a reproducing apparatus 1' practiced as the second embodiment of the invention. It should be noted that, with reference to FIG. 8, components similar to those of the reproducing apparatus 1 previously described with reference to FIG. 1 are denoted by the same reference numerals and the description thereof will be skipped.

In the reproducing apparatus 1', various kinds of signal processing are executed, by a DSP 21 arranged in a digital signal processing block 11, on digital audio signals supplied from various audio signal sources and the processed signals are supplied to a D/A conversion block 22. Each digital audio signal supplied to the D/A conversion block 22 is converted into an analog audio signal to be supplied to an analog volume 24 of the analog signal processing block 12. The analog audio signal supplied to the analog volume 24 is amplified by a control block 13 to a predetermined level and the amplified signal is outputted from a loudspeaker 34 via an amplifier 25.

On the basis of a control signal supplied from an operating block 14, the control block 13 generates a boost signal for executing the boost processing for amplifying the component of a particular frequency band of the audio signal and supplies the generated boost signal to the DSP 21. Also, on the basis of a control signal supplied from the operating block 14, the control block 13 generates a volume signal for setting an amplification amount of the audio signal and supplies the generated volume signal to the analog volume 24.

Figure 9:
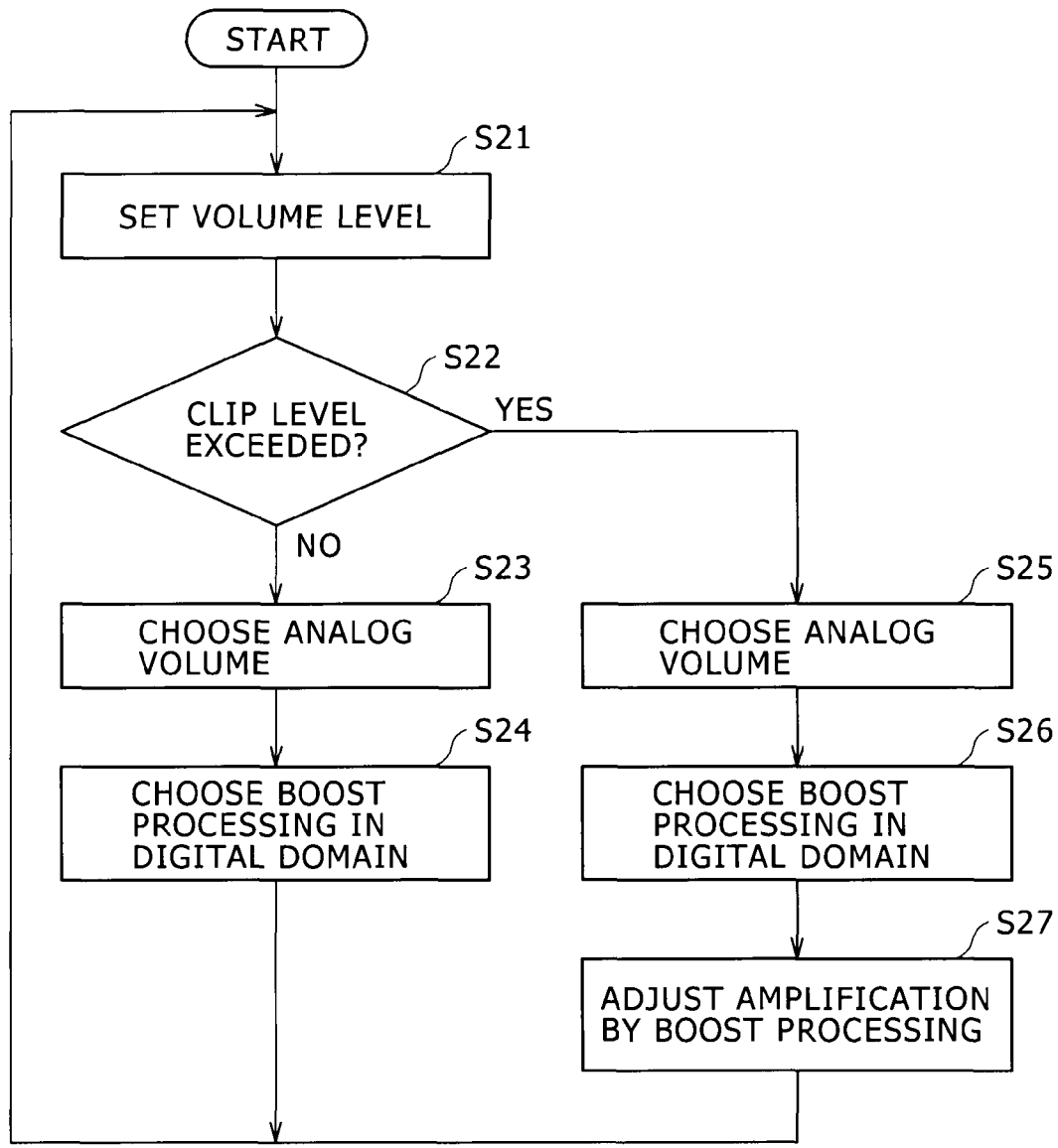
FIG. 9 is a flowchart indicative of reproduction processing of an audio signal according to the second embodiment of the invention.
Figure 10:
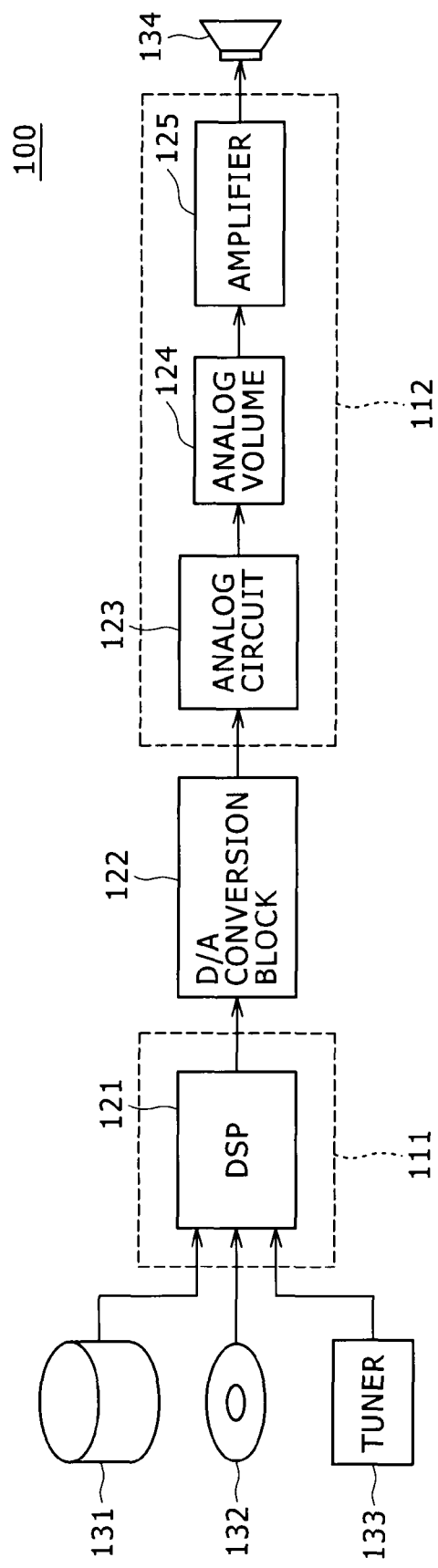
FIG. 10 is a block diagram illustrating an exemplary configuration of an existing reproducing apparatus.
Figure 11:
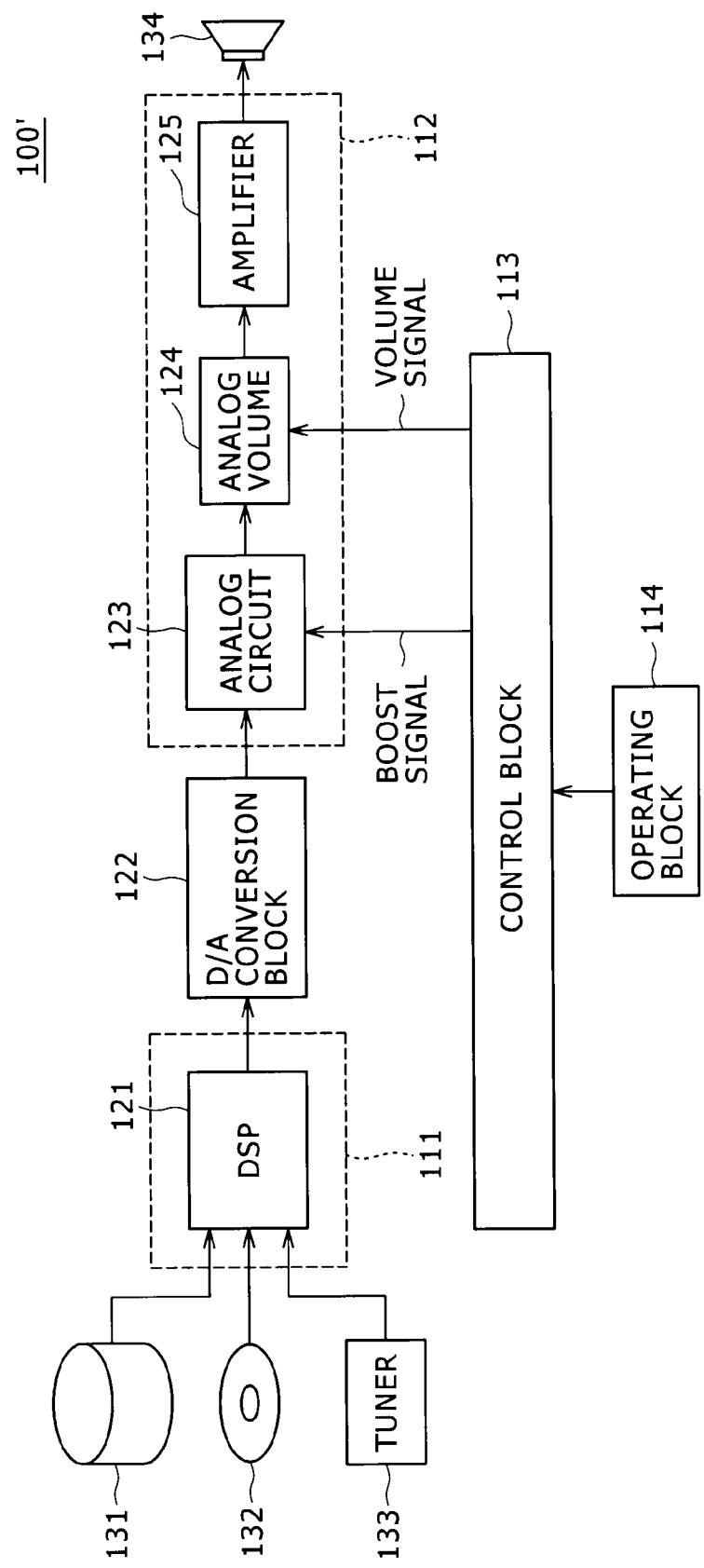
FIG. 11 is a block diagram illustrating an exemplary configuration of a reproducing apparatus for executing boost processing on an audio signal in the analog domain.
Figure 12:
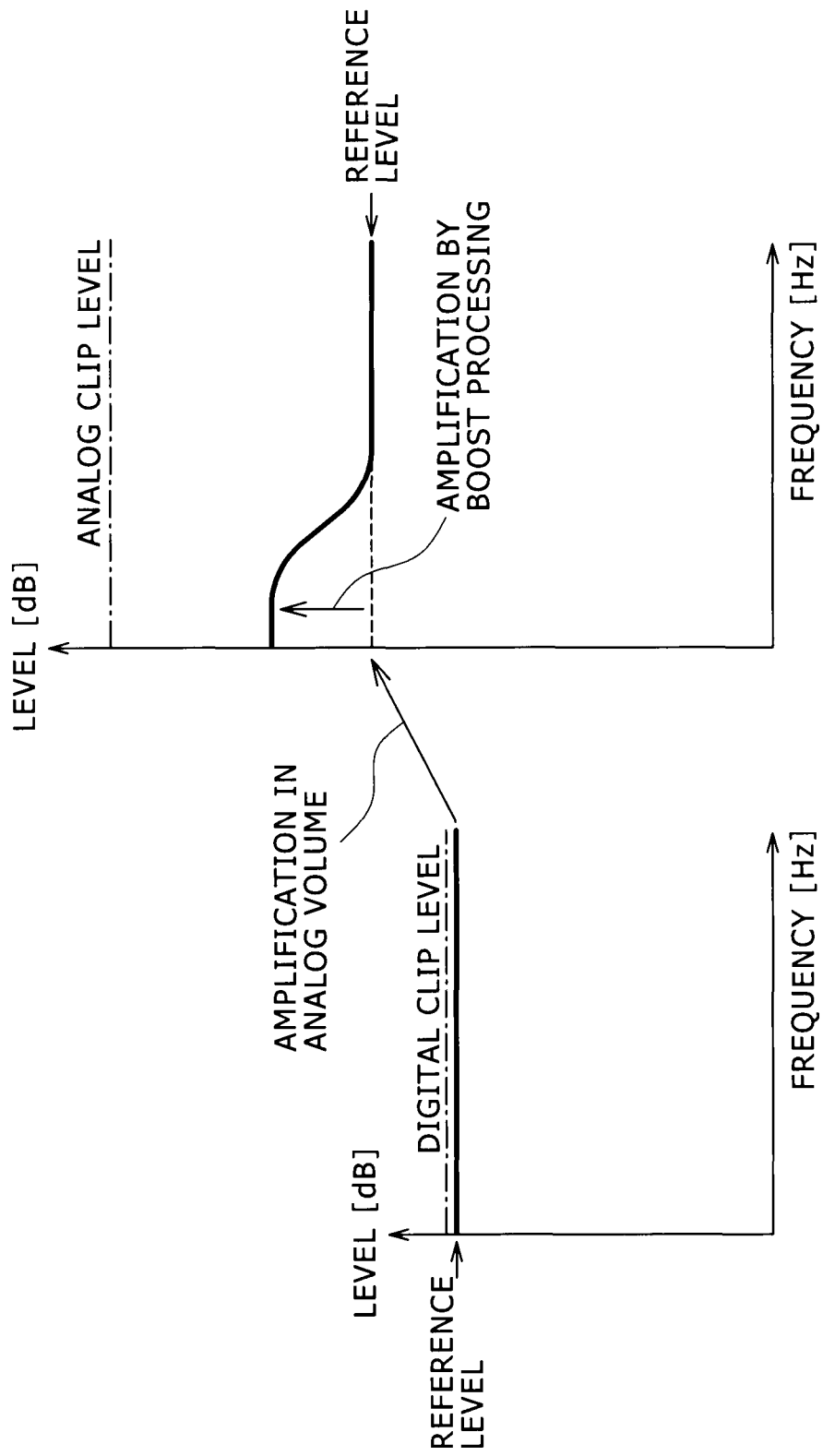
FIG. 12 shows graphs indicative of audio signals with boost processing executed in the analog domain.
Figure 13:
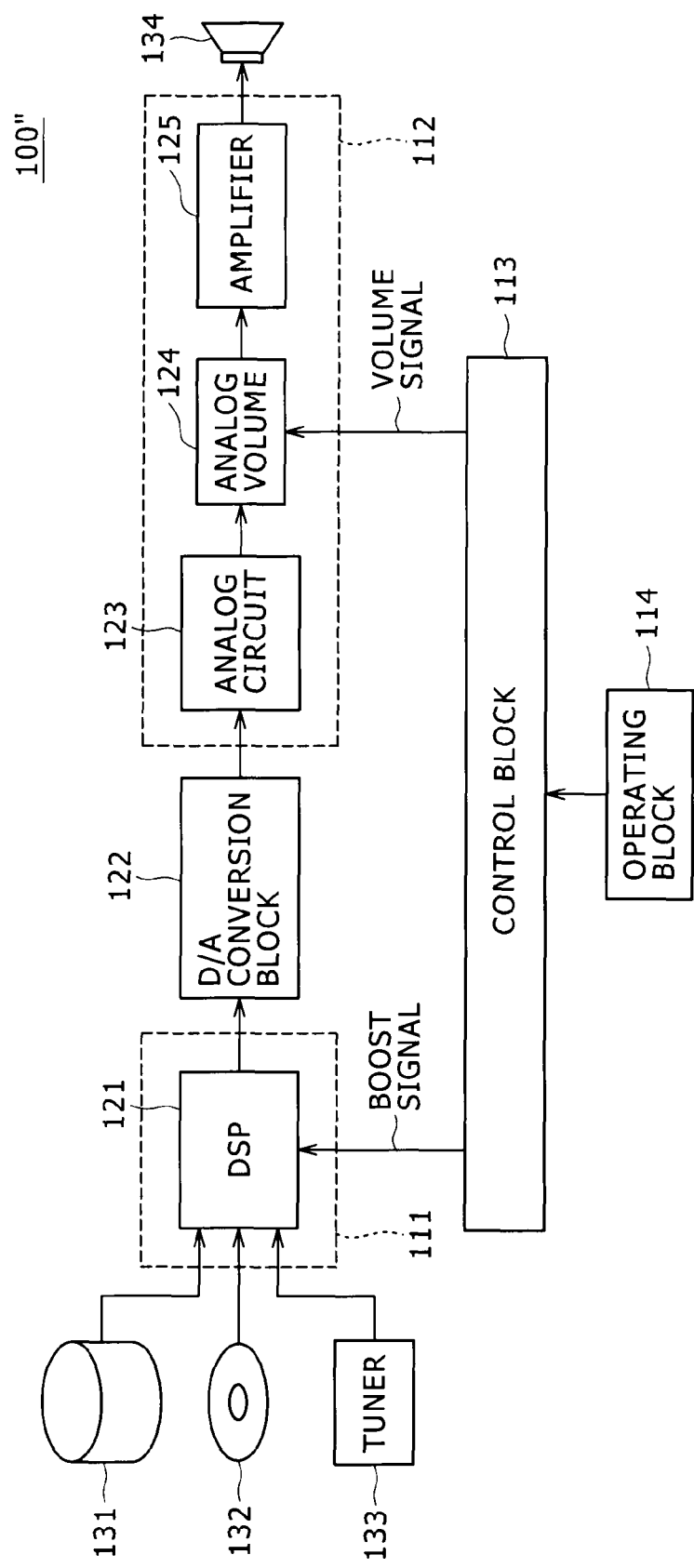
FIG. 13 is a block diagram illustrating an exemplary configuration of a reproducing apparatus for executing boost processing on an audio signal in the digital domain.
Figure 14:
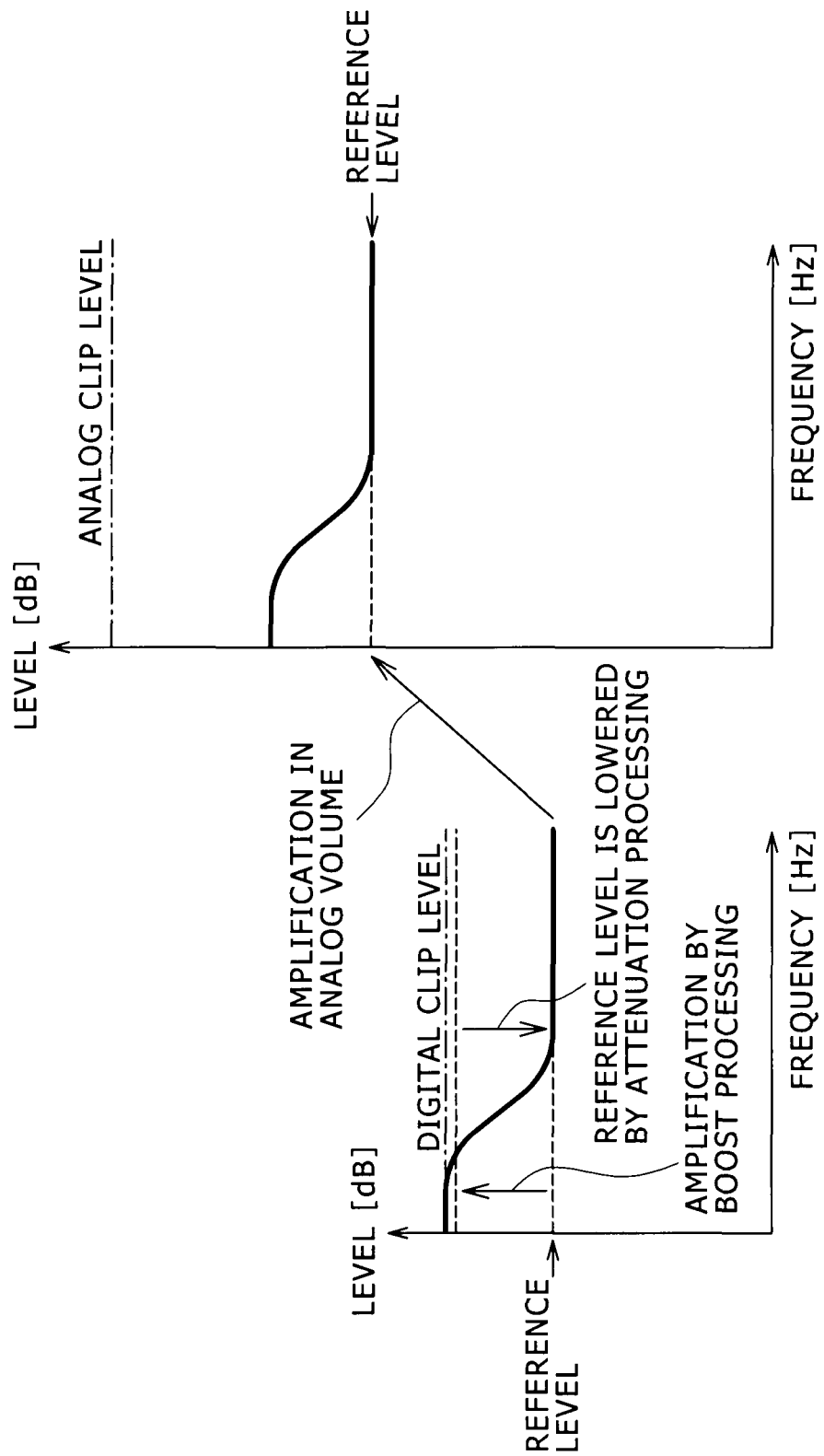
FIG. 14 shows graphs indicative of audio signals with boost processing executed in the digital domain.

The following describes the reproduction processing of an audio signal according to this second embodiment of the invention with reference to FIG. 9. It should be noted that, unless otherwise specified, the processing shown below is executed under the control of the control block 13. When a volume level in accordance with an operation done by the user through the operating block 14 is set in step S21, an analog audio signal is amplified by the analog volume 24 in accordance with the set volume level.

In step S22, the control block 13 determines whether or not the analog audio signal is in excess of the analog clip level. If the analog audio signal is found not in excess of the analog clip level, the procedure goes to step S23, in which the analog volume 24 is chosen as a volume for use in the setting of volume level. In step S24, the boost processing in the digital domain is chosen and the procedure returns to step S21.

On the other hand, if the analog audio signal is found in excess of the analog clip level in step S22, then the procedure goes to step S25, in which the analog volume 24 is chosen as it is as the volume for use in the setting of volume level.

In step S26, the boost processing in the digital domain is chosen. In step S27, the amplification amount by the boost processing is adjusted so as to prevent the low frequency component of the digital audio signal amplified by the boost processing from exceeding the digital clip level. When the processing of step S25 or step S27 has been completed, the procedure returns to step S21, in which, when the setting of volume level is executed again, the above-mentioned sequence of processing is repeated.

As described above, in the second embodiment of the invention, the boost processing on audio signals is also always executed in the digital domain to prevent the distortion of audio signals, thereby properly reproducing audio signals.

While the first embodiment, the variation thereto, and the second embodiment of the present invention have been described using specific terms, such description is for illustrative purpose only, and it is to be understood that changes and variations may be made without departing from the spirit or scope of the following claims.

For example, the amplification of the low frequency component of an audio signal has been described above, but not exclusively, as the boost processing; the boost processing may also include the amplification of the high or mid frequency component of an audio signal, for example.

The present application contains subject matter related to that disclosed in Japanese Priority Patent Application JP 2008-143125 filed in the Japan Patent Office on May 30, 2008, the entire content of which is hereby incorporated by reference.

What is claimed is:

1. A reproducing apparatus comprising:
   circuitry configured to
   execute first boost processing to digitally set a volume level of an entered digital audio signal and to digitally boost an amplitude level of a predetermined frequency band of the digital audio signal,
   convert the digital audio signal into an analog audio signal;
   an analog circuit configured to execute second boost processing to boost an amplitude level of the predetermined frequency band of the analog audio signal; and
   an analog volume adjusting circuit configured to set a volume level for the analog audio signal outputted from the analog signal processing circuit,
   wherein the circuitry is further configured to
   indicate a volume level of an audio signal outputted from a loudspeaker that outputs the analog audio signal outputted from the analog volume adjusting block, and
   turn on/off the boost processing for the audio signals,
   determine whether the volume level exceeds at least one of a digital clip level and an analog clip level,
   cause execution of the first boost processing when the volume level exceeds the analog clip level, and
   cause execution of the second boost processing when the volume level exceeds the digital clip level.

2. A reproducing method comprising:
   executing first boost processing to digitally set a volume level for an entered digital audio signal and to digitally boost an amplitude level of a predetermined frequency band of the digital audio signal when the volume level does not exceed a digital clip level;
   converting the digital audio signal into an analog audio signal;
   executing second boost processing for boosting an amplitude level of the predetermined frequency band of the analog audio signal when the volume level does not exceed an analog clip level;
   selecting the first boost processing when the volume level exceeds the analog clip level;
   selecting the second boost processing when the volume level exceeds the digital clip level;
   outputting the analog audio signal after boost processing;
   indicating a volume level of an audio signal outputted from a loudspeaker and turning on/off the boost processing for the audio signals.

3. The reproducing apparatus according to claim 1, wherein the circuitry is further configured to cause execution of both the first and second boost processing when the volume level does not exceed the digital clip level and the volume level does not exceed the analog clip level.

4. The reproducing apparatus according to claim 1, wherein the circuitry is further configured to lower a reference level of the digital audio signal and to increase a reference level of the analog audio signal when performing the first boost processing.

5. The reproducing method according to claim 2, further comprising:
   lowering a reference level of the digital audio signal and increasing a reference level of the analog audio signal when executing the first boost processing.

* * * * *